United States Patent [19]

Siemon

[11] 4,452,847

[45] Jun. 5, 1984

[54] SHEET MATERIAL IMPREGNATED WITH A HIGHLY CROSS LINKED THERMALLY STABLE EPOXY COMPOSITION

[75] Inventor: John T. Siemon, Plum Borough, Pa.

[73] Assignee: Westinghouse Electric Corp., Pittsburgh, Pa.

[21] Appl. No.: 442,479

[22] Filed: Nov. 17, 1982

[51] Int. Cl.³ .............................................. B32B 7/00
[52] U.S. Cl. .................................. 428/246; 174/68.5; 361/414; 428/251; 428/273; 428/413; 428/415; 428/417; 428/901; 428/920
[58] Field of Search ............... 428/251, 268, 273, 413, 428/414, 415, 417, 901, 246, 920; 174/68.5; 361/414

[56] References Cited

U.S. PATENT DOCUMENTS 4,327,143  4/1982  Alvino et al. ..................... 428/251

Primary Examiner—James J. Bell
Attorney, Agent, or Firm—D. P. Cillo

[57] ABSTRACT

An alkyl-di-substituted imidazole, is used as accelerator and co-curing agent in epoxy coating and impregnating resins useful in the manufacture of high temperature multi-layer laminates.

6 Claims, 1 Drawing Figure

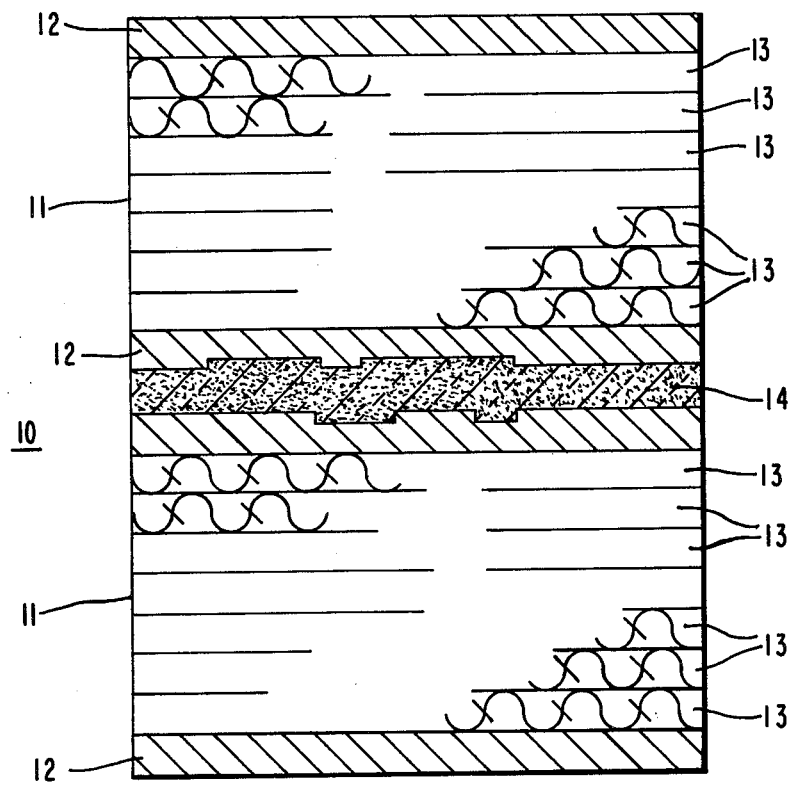

SHEET MATERIAL IMPREGNATED WITH A HIGHLY CROSS LINKED THERMALLY STABLE EPOXY COMPOSITION

BACKGROUND OF THE INVENTION

Glass cloth laminates, useful as core layers for printed circuit boards, utilizing epoxy resin impregnating compositions are well known, and taught, for example, by Alvino et al., in U.S. Pat. No. 4,327,143. In the Alvino et al. compositions, flame retardants, such as chlorinated phenols, could be included, and the epoxy resin was cured primarily by a monomethylol dicyandiamide-methyl Cellosolve solution. Co-curing agents could include 0 wt. % to 2 wt. %, based on monomethylol dicyandiamide, of an amine, such as benzyl dimethylamine, pyridine, quinoline, pyrazine, and single carbon mono substituted imidazoles, such as imidazole, 1 methyl imidazole, and 2 methyl imidazole. Potassium carbonate or tetramethyl ammonium hydroxide could be used as accelerators.

The resin system used in Alvino et al., while eliminating moisture crystallization problems in the core, could be improved in terms of gel time, and thermal stability, i.e., glass transition temperatures, Tg (DSC) value, which is about 114° C. to 125° C. for molded, cured laminates. Also, its flow characteristics are not suitable for coating very thin glass cloth substrates used as adhesive spacers in multilayer circuit boards. Additionally, use of a benzyl dimethylamine type co-curing agent requires substantial aging of the resin system before use, which requires special storage facilities, and which is expensive and inconvenient in commercial operation.

There has been a long felt need for less expensive resin systems that can be used in manufacturing high temperature multilayer circuit boards, where the resin better wets and coats glass cloth substrates, especially thin spacer substrates, where thermal stability, i.e., Tg (DSC) values, of molded, cured impregnated laminates are above about 150° C., where impregnated, "B"-staged pre-preg substrates maintain several months storage stability and good resistance to crystallization, and where faster pre-preg processing times result.

SUMMARY OF THE INVENTION

The above needs have been met and the above problems solved by using an alkyl-di-substituted imidazole, where alkyl is at least 2 carbons, instead of benzyl dimethyl amine or a mono substituted imidazole, such as 2 methyl imidazole, as co-curing agent in resin systems useful in multilayer circuit board laminates, particularly in adhesive spacers. The alkyl-di-substituted imidazole was found to act in a dual function, as an accelerator in the "B" stage of cure, and as a co-curing cross-linker in the "C" stage of cure. Useful alkyl-di-substituted imidazoles include 2-alkyl, 4-methyl imidazoles, where alkyl is a group having from 2 to 8 carbon atoms. The preferred di-substituted imidazole is 2-ethyl, 4-methyl imidazole. The use of the di-substituted imidazole provides glass transition temperatures (Tg values using a Perkin Elmer DSC) of over about 150° C. for cured, impregnated glass cloth, indicating good dimensional stability and low expansion properties.

Additionally, glass-wetting, flow and coating properties on thin glass sheets were excellent, as was storage stability and resistance to crystallization. No resin aging was required. These epoxy resin systems can be coated and impregnated into woven glass cloth for use as core layers and particularly as adhesive spacers in multilayer printed circuit boards. These resin systems may also provide useful, fast curing, low expansion adhesives for miniature electrical devices and the like, and as flame retardant potting compositions.

BRIEF DESCRIPTION OF THE DRAWINGS

For a better understanding of the invention, reference may be made to the preferred embodiments, exemplary of the invention shown in the accompanying drawing of a multilayer printed circuit board containing the adhesive layer spacing of this invention disposed between two printed circuit boards.

DETAILED DESCRIPTION OF THE INVENTION

Epoxy resins that are suitable for the alkyl-di-substituted imidazole containing adhesive coating of this invention include diglycidyl ethers of bisphenol A, diglycidyl ethers of bisphenol F, polyglycidyl ethers of a novolac, glycidyl esters hydantoin epoxy resins, cycloaliphatic epoxy resins containing 3 or 4 membered rings, and diglycidyl ethers of aliphatic diols, all of which are commercially available and described in detail be Smith, et al., in U.S. Pat. No. 4,273,914. The preferred epoxy resin is a liquid diglycidyl ether of bisphenol A having an epoxy equivalent weight of between about 185 and 210. Any halogenated phenol or halogenated aldehyde may be used as a flame retardant in an amount effective to impart flame resistance to the cured product, but tetrabromo bisphenol A is particularly effective in this regard.

Methyl Cellosolve (2-methoxy ethanol) is the preferred diluent for the primary curing agent and the flame retardant material in the resin mixture. However, ethyl Cellosolve, methyl ethyl ketone, dimethyl formamide, and the like, may be used as a dissolution medium. The primary curing agent is preferably dicyandiamide, a dicyandiamide derivative such as monomethylol dicyandiamide (N-cyano-N'-hydroxymethyl guanidine), or mixtures thereof. Monomethylol dicyandiamide is preferred and its production is described in detail in U.S. Pat. No. 4,327,143.

Di-substituted imidazoles that are suitable for the epoxy based impregnating resin include 2-alkyl, 4-methyl imidazoles and mixtures thereof, where the alkyl group of the compound contains from 2 to 8 carbon atoms. The preferred imidazole is 2-ethyl, 4-methyl imidazole. The structure for the imidazoles useful in this invention is shown below:

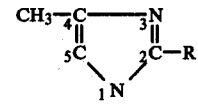

The position of R=alkyl from 2 to 8 carbons at the No. 2 carbon of the ring as shown is critical. An alkyl chain length of at least 2 carbons is essential to provide an electron pushing effect from the alkyl group R to the No. 1 and No. 3 nitrogens in the imidazole ring. While not completely understood at this time, this electron pushing effect is believed to activate the imidazole nitrogens to enable the compound to act as an epoxy ring opener during "B"-staging, allowing quick epoxy polymerization and fast "B"-stage resin gel formation. Alkyl of one carbon at the No. 2 carbon of the ring would have little electron pushing effect, and an alkyl of two or more carbons at the No. 1, 3, 4 or 5 positions in the ring would also have minimal effect. Alkyl of 2 or more carbons is effective in this invention only at the No. 2 carbon position.

Addition of the alkyl-di-substituted imidazole to the epoxy resin system eliminates the need for potassium carbonate accelerator, and reduces the required amount of diluent, such as Cellosolve, by about 25%, and the required amount of dicyandiamide or monomethylol dicyandiamide by 25% to 35%, providing substantial cost savings. The useful weight ratio of (epoxy resin): (flame retardant): (diluent): (curing agent): (alkyl-di-substituted imidazole co-curing initiator) is from about (100): (0 to 155): (20 to 100): (2.0 to 2.5): (0.5 to 1.0).

Use of the alkyl di-substituted imidazole to catalyze and co-cure the epoxy results in a shorter "B"-stage time and accordingly can reduce the resin flow or greenness significantly. In adddition to good storage stability, the epoxy based resin containing the alkyl di-substituted imidazole requires no maturing or aging period before use, as is required when using benzyl-dimethylamine as co-catalyst.

In addition to acting as the polymerization initiator, the alkyl-di-substituted imidazole also reacts during the press cure cycle to provide additional cross-links to the polymerized epoxy in the cured "C"-stage, to provide Tg (DSC) values, i.e., utilizing well known Differential Scanning Colorimetry, of at least about 150° C. for the resin or the substrate impregnated with the resin.

Referring now to the drawing, a unitary bonded, multi-layer, laminated circuit board 10, comprising two circuit boards, is shown. The multi-layer circuit board consists of two core layers 11 each bonded to two metal foil conductor sheets 12, preferably copper usually having an etched pattern therein, to provide electrical circuits. In one embodiment, one or both of the interior metal foils can be eliminated. The core layers comprise a plurality of sheets 13 as shown. Adhesive spacer 14 impregnated with the resin of this invention is shown disposed between the interior metal foils. The spacer sheets comprise at least one sheet, preferably a single woven glass cloth sheet about 1.0 to 3.0 mil thick. The resin of this invention could also be used to impregnate the sheets 13 in the core. In one embodiment, the individual sheets of core and foil can be consolidated to form the circuit boards, the adhesive spacer inserted between the two circuit boards, and the whole consolidated at from 500 psi. to 1500 psi. and 150° C., causing the adhesive sheet to flow somewhat to conform to the copper foil patterns of the interior foils and bond the two circuit boards together to provide a multi-layer circuit board laminate.

EXAMPLE 1

Three epoxy resin impregnating systems were prepared. To a 1,000 cc. Pyrex glass flask equipped with a stirrer and thermometer, were added: 100 parts of a liquid diglycidyl ether of bisphenol A epoxy resin having an epoxy equivalent weight of 193 to 203 and a viscosity at 25° C. of 3,000 to 7,000 cps. (sold commercially by Shell Chemical Co. under the Tradename Epon 829); and 154.3 parts of tetrabromobisphenol A (TBBPA). The mixture was heated to 90° C. and then cooled to about 25° C.

To these epoxy formulations were added an amount of dicyandiamide curing agent needed to cure the total epoxy. The solid dicyandiamide curing agent was first dissolved in methyl Cellosolve at about 75° C., cooled, and then added to the formulations. To one resin system, a comparative system, benzyl dimethyl amine (BDMA) and potassium carbonate were added. To another resin system, a comparative system, 2 methyl imidazole, a mono substituted imiadazole was added. To the resin system of this invention, 2-ethyl, 4-methyl imidazole was added. A comparison of resin formulations for the comparative resins and the di-substituted imidazole resin is shown below in Table 1 below.

TABLE 1

|  | Sample (1): Comparative BDMA Resin | Sample (2): Comparative Mono-Substituted Imidazole Resin | Sample (3): Di-Substituted Imidazole Resin |
| --- | --- | --- | --- |
| Epoxy Resin | 100.0 phr | 100.0 phr | 100.0 phr |
| Dicyandiamide | 3.8 | 2.5 | 2.5 |
| Methyl Cellosolve | 55.0 | 41.2 | 41.2 |
| TBBPA | 154.3 | 154.3 | 154.3 |
| BDMA | 0.47 | — | — |
| H$_2$O/K$_2$CO$_3$ | .55/.29 | — | — |
| 2-ethyl, 4-methyl imidazole | — | — | 0.63 |
| 2 methyl imidazole | — | 0.63 | — |

Glass fabric sheet material, having a thickness of 2 mils, was passed through the resin baths containing each of the resin systems to provide 3 sheets, each impregnated with different epoxy systems. The impregnated sheets were then passed between rolls, to remove excess resin, after which they were passed at a rate of 40 feet/min. through a 50 ft. long treating tower oven operating at a temperature of from about 120° C. to 145° C. The impregnated glass fabric exiting the oven had a resin content of about 43 wt. % based on the dry weight of the fabric. The resin impregnated glass fabric samples were non-tacky and dry to the touch, but fusible and not completely cured, i.e., "B"-staged, to provide 3 sample pre-pregs. The "B"-staged glass fabric impregnated with the resin system using 2-ethyl, 4-methyl imidazole maintained a shelf life of about 2 weeks. Greenness of a hot pressed 4 layer stack of the impregnated glass fabric was measured for 2 samples, and is shown in Table 2 below.

TABLE 2

| Pre-preg Conditions | Comparative BDMA Resin | Di-Substituted Imidazole Resin |
| --- | --- | --- |
| Resin Content | ~43.0% | ~43.0% |
| 5 Min. @ 145° C. & 300 psi | 21.2% Flow | 17.0% Flow |
| 6 Min. @ 145° C. & 300 psi | 18.3% Flow | 1.7% Flow |

The di-substituted imidazole resin impregnated sheet showed fast cure after 5 minutes, in that at 6 minutes only 1.7% of the resin flowed out of the edge of the compressed laminate.

Eight cut sheets of each of the three resin impregnated glass fabric sheet materials were separately placed in a laminating press and heat and pressure consolidated at 160° C. and 1,000 psi. A number of laminates for each sample resin were made. The glass transition temperature, i.e., Tg, of each of the resin impregnated laminates was measured using Perkin Elmer Differential Scanning Colorimetry, and the results are shown below in Table 3.

TABLE 3

| Sample | Tg Comparisons Co-curing Ingredient | Ave. Tg |
| --- | --- | --- |
| 3 | 2 ethyl, 4-methyl imidazole | 163° C. |
| 2* | 2 methyl imidazole | 120° C. |
| 1* | Benzyldimethylamine | 116° C. |

As can be seen from Tables 2 and 3, use of a two carbon alkyl-di-substituted imidazole provides fast cures and substantially higher Tg (DSC) values, providing fast "B"-stage processing times, and good dimensional stability and low expansion properties in the resulting laminates or individual impregnated glass fabric sheets. Also, no $K_2CO_3$ and substantially less dicyandiamide and methyl Cellosolve was required in Sample (3) vs. comparative Sample (1), lowering costs substantially. Monomethylol dicyandiamide and alkyl-di-substituted imidazoles where alkyl is propyl, butyl, etc. can be substituted with equally outstanding results.

I claim:

1. A "B"-staged adhesive resin impregnated material comprising glass fabric, the resin comprising:
   (A) epoxy resin;
   (B) curing agent selected from the group consisting of dicyandiamide, monomethylol dicyandiamide, and mixtures thereof; and
   (C) accelerator, co-curing agent consisting of 2-alkyl, 4-methylimidazole having the structural formula:

$$CH_3-\underset{5C}{\overset{4C}{\underset{\|}{C}}}\underset{1N}{\overset{3N}{\underset{\|}{\diagdown}}}\overset{}{\underset{2C-R,}{\diagup}}$$

where the alkyl group R contains from 2 to 8 carbon atoms, where the weight ratio of (epoxy): (curing agent): (2-alkyl, 4-methylimidazole) is from about (100): (2.0 to 2.5): (0.5 to 1.0), said impregnated material characterized as having a Tg (DSC) value of over about 150° C. upon complete cure.

2. The resin impregnated material of claim 1 being glass fabric; and wherein the epoxy resin is a diglycidyl ether of bisphenol A, the impregnated material is characterized as being thermally stable, and having low expansion properties upon complete cure, and the resin has a fast, "B"-stage gel time.

3. The resin impregnated material of claim 1, also containing an effective amount of flame retardant and an effective amount of diluent for the flame retardant and the curing agent.

4. The resin impregnated material of claim 1, wherein the 2-alkyl, 4-methylimidazole is 2-ethyl, 4-methylimidazole.

5. A laminated multilayer printed circuit board comprising at least two circuit boards, each circuit board comprising at least one metal conductor sheet supported by a core laminate, with an adhesive separator disposed between at least two circuit boards in the multilayer board, the adhesive separator being the cured resin impregnated material of claim 1.

6. The multilayer printed circuit board of claim 5, wherein the metal conductor sheet is a patterned copper electrical circuit and the resin impregnated material in the adhesive separator is glass fabric.

* * * * *